United States Patent [19]
Chen et al.

[11] Patent Number: 5,703,375
[45] Date of Patent: Dec. 30, 1997

[54] METHOD AND APPARATUS FOR ION BEAM NEUTRALIZATION

[75] Inventors: Jiong Chen, Beverly; Victor M. Benveniste, Gloucester, both of Mass.

[73] Assignee: Eaton Corporation, Cleveland, Ohio

[21] Appl. No.: 691,467

[22] Filed: Aug. 2, 1996

[51] Int. Cl.⁶ .................... H01J 37/317; H01L 21/265
[52] U.S. Cl. .................... 250/492.21; 250/251
[58] Field of Search ................ 250/492.21, 251

[56] References Cited

U.S. PATENT DOCUMENTS

| | | | |
|---|---|---|---|
| 4,804,837 | 2/1989 | Farley | 250/251 |
| 5,164,599 | 11/1992 | Benveniste | 250/492.2 |
| 5,531,420 | 7/1996 | Benveniste | 250/251 |

FOREIGN PATENT DOCUMENTS

| | | | |
|---|---|---|---|
| 63-221539 | 9/1988 | Japan | 250/251 |
| 3-216945 | 9/1991 | Japan | 250/492.21 |

OTHER PUBLICATIONS

Wollnik, Hermann *Optics of Charged Particles*, Academic Press, Inc., pp. 118–119, 280–285, (1987) no month.
Holmes, AJT *Electron Flow Through Transverse Magnetic Fields in Magnetic Multipole Arc Discharges*, American Institute of Physics, pp. 1517–1522, Oct. 1982.
HF Glavish, Magnet Optics for Beam Transport, *Nuclear Instruments and Methods* 189, North–Holland Publishing company, pp. 43–53, (1981) no month.

*Primary Examiner*—Jack I. Berman
*Attorney, Agent, or Firm*—Watts, Hoffmann, Fisher & Heinke Co. L.P.A.

[57] ABSTRACT

Method and apparatus for maintaining an ion beam along a beam path from an ion source to an ion implantation station where workpieces are treated with the ion beam. An ion beam neutralizer is positioned upstream from the ion treatment station and includes confinement structure which bounds the ion beam path. An electron source positioned within the confinement structure emits electrons into the ion beam. An array of magnets supported by the confinement structure creates a magnetic field which tends to confine the electrons moving within the confinement structure. An interior magnetic filter field is created inside the confinement structure by a plurality of axially elongated filter rods having encapsulated magnets bounding the ion beam and oriented generally parallel to the ion beam path. This interior magnetic field confines higher energy electrons from leaving the ion beam path and permits lower energy electrons to drift along the ion beam.

22 Claims, 8 Drawing Sheets

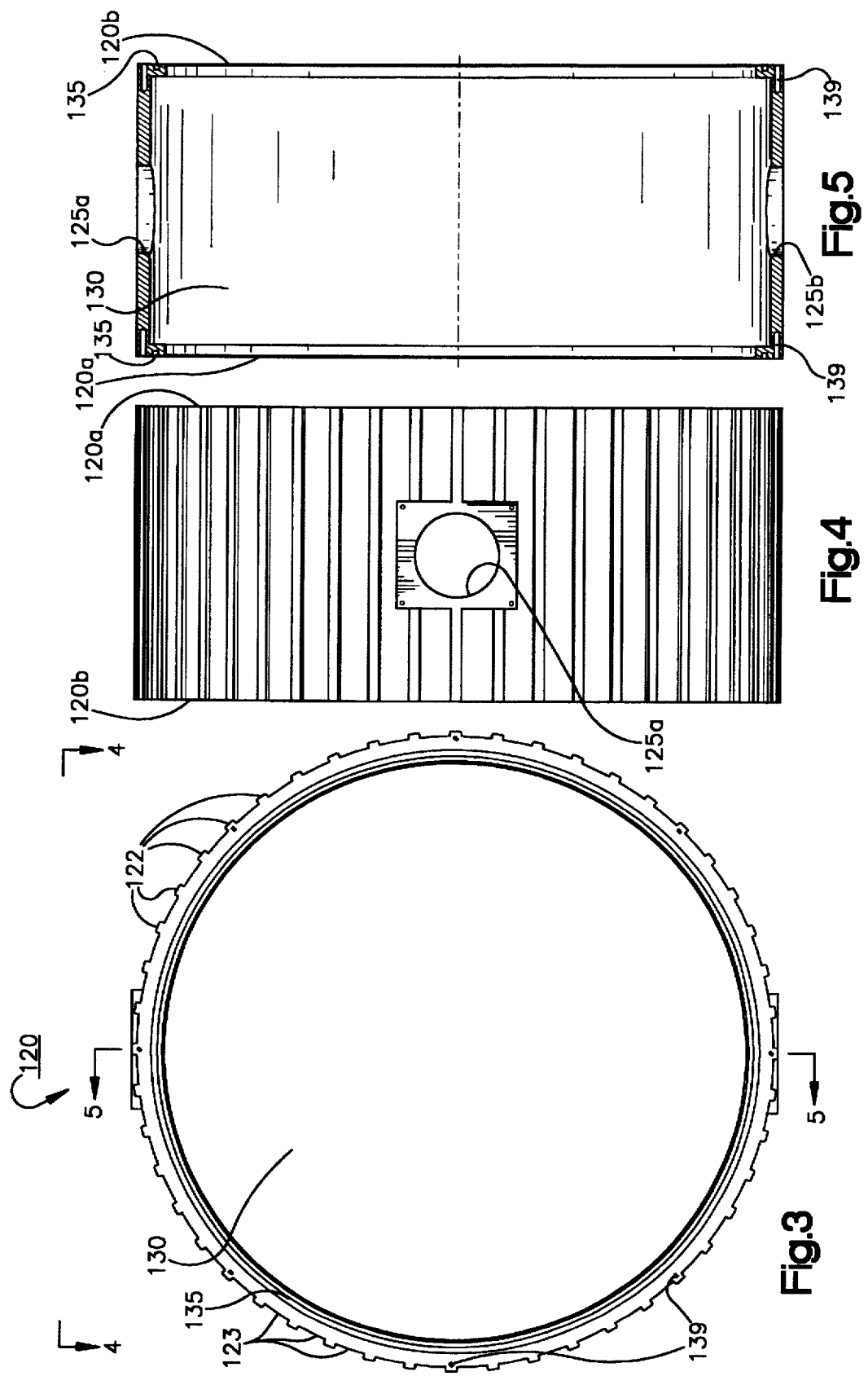

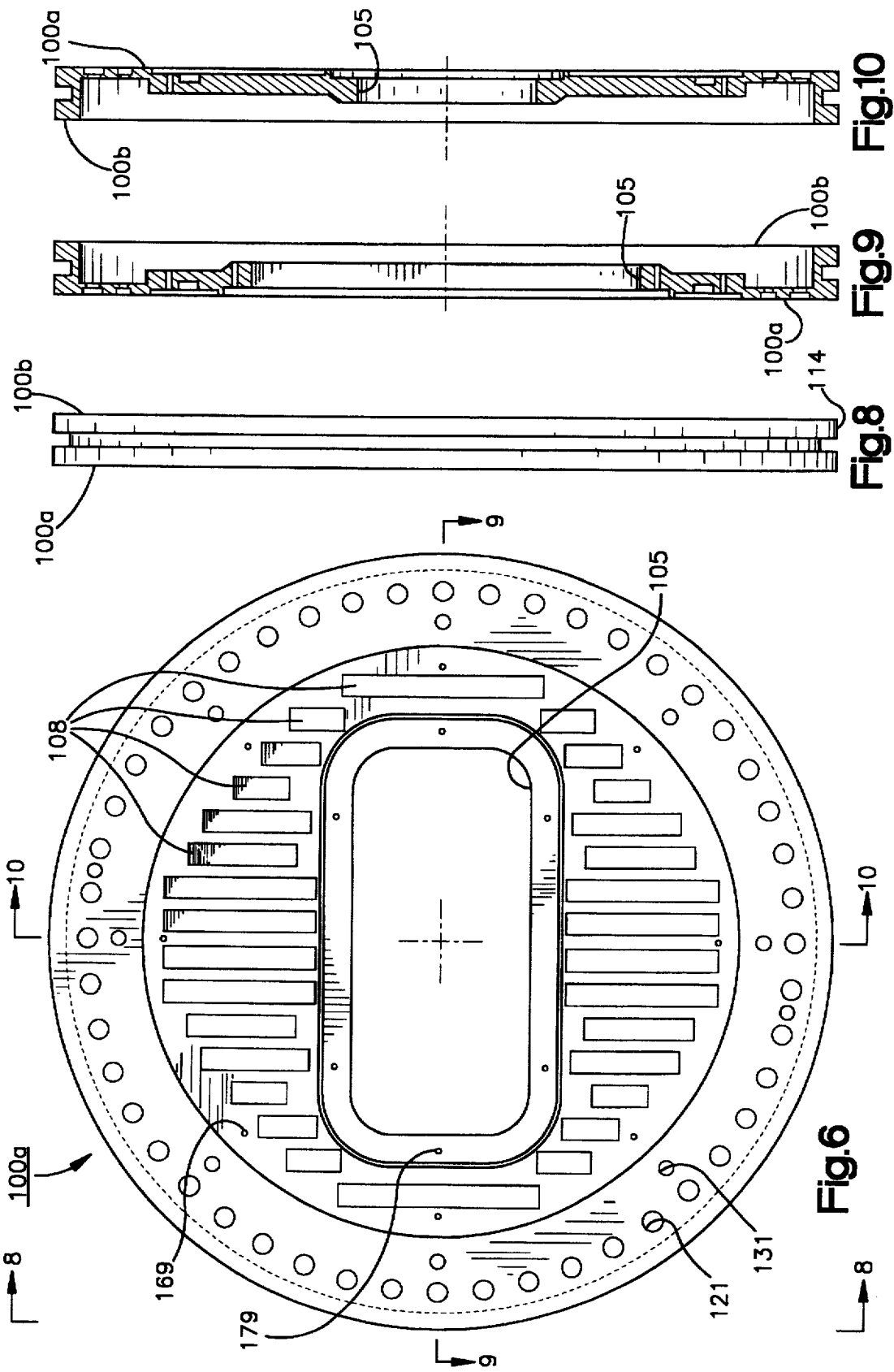

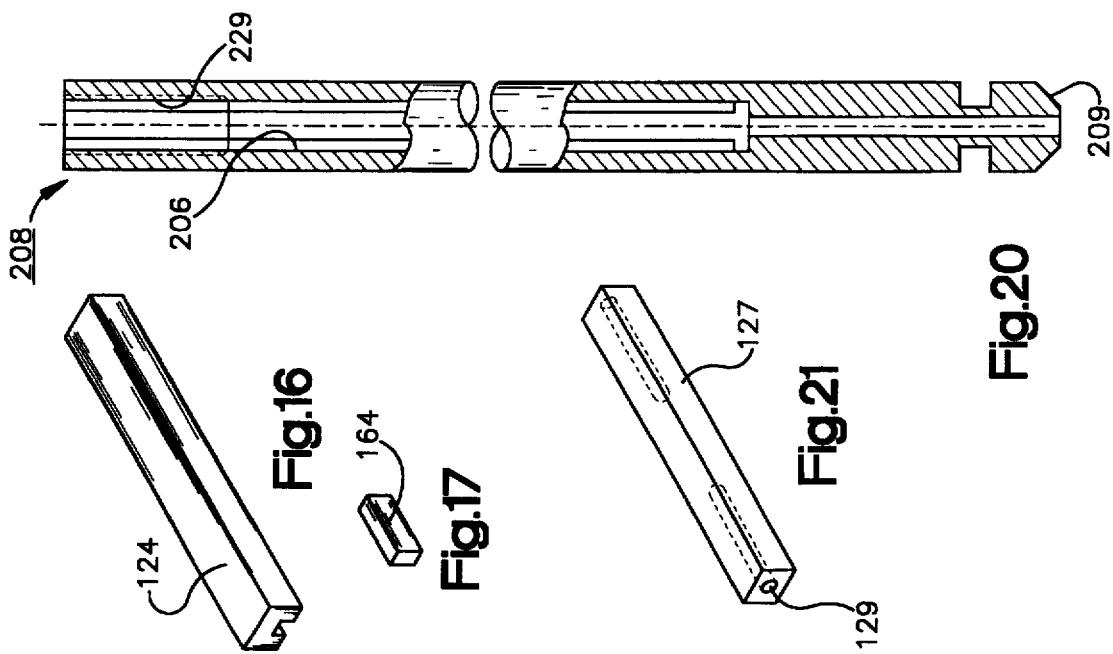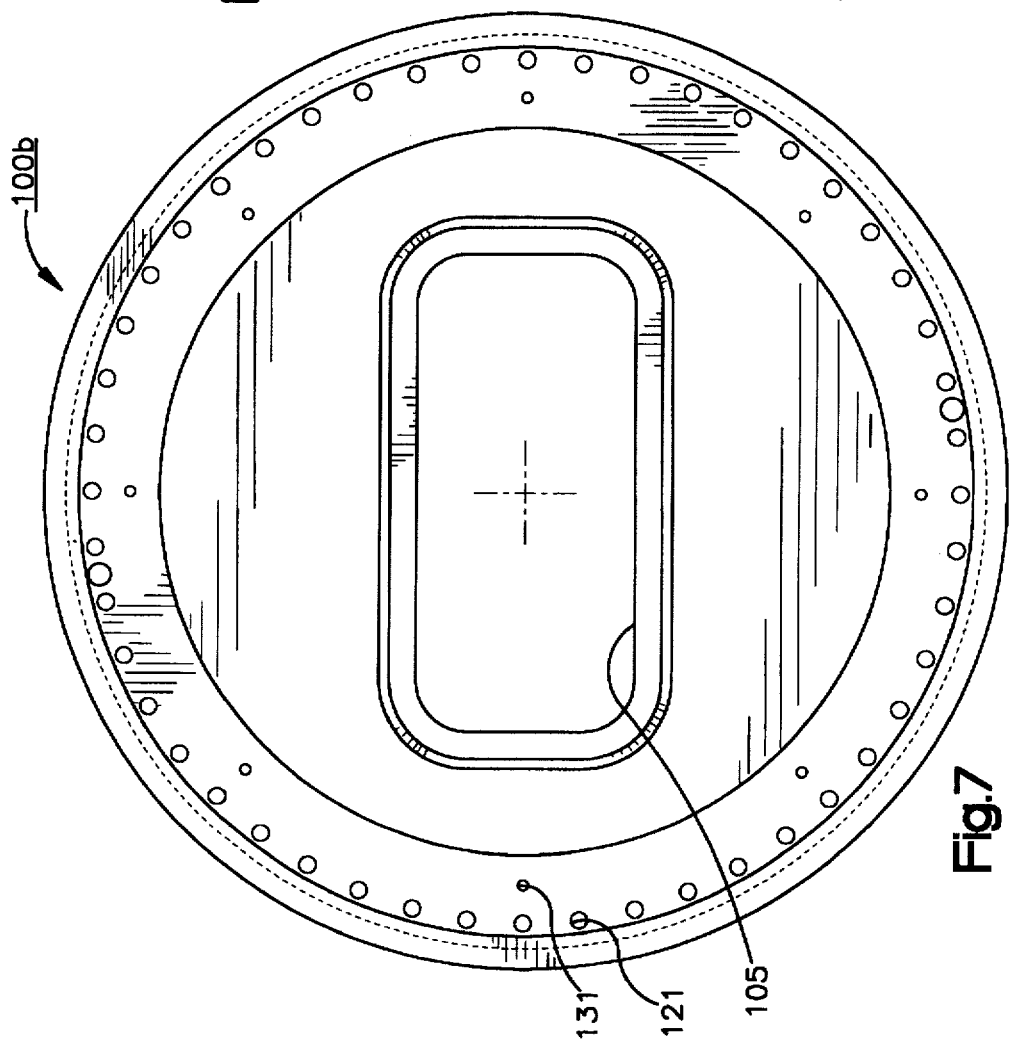

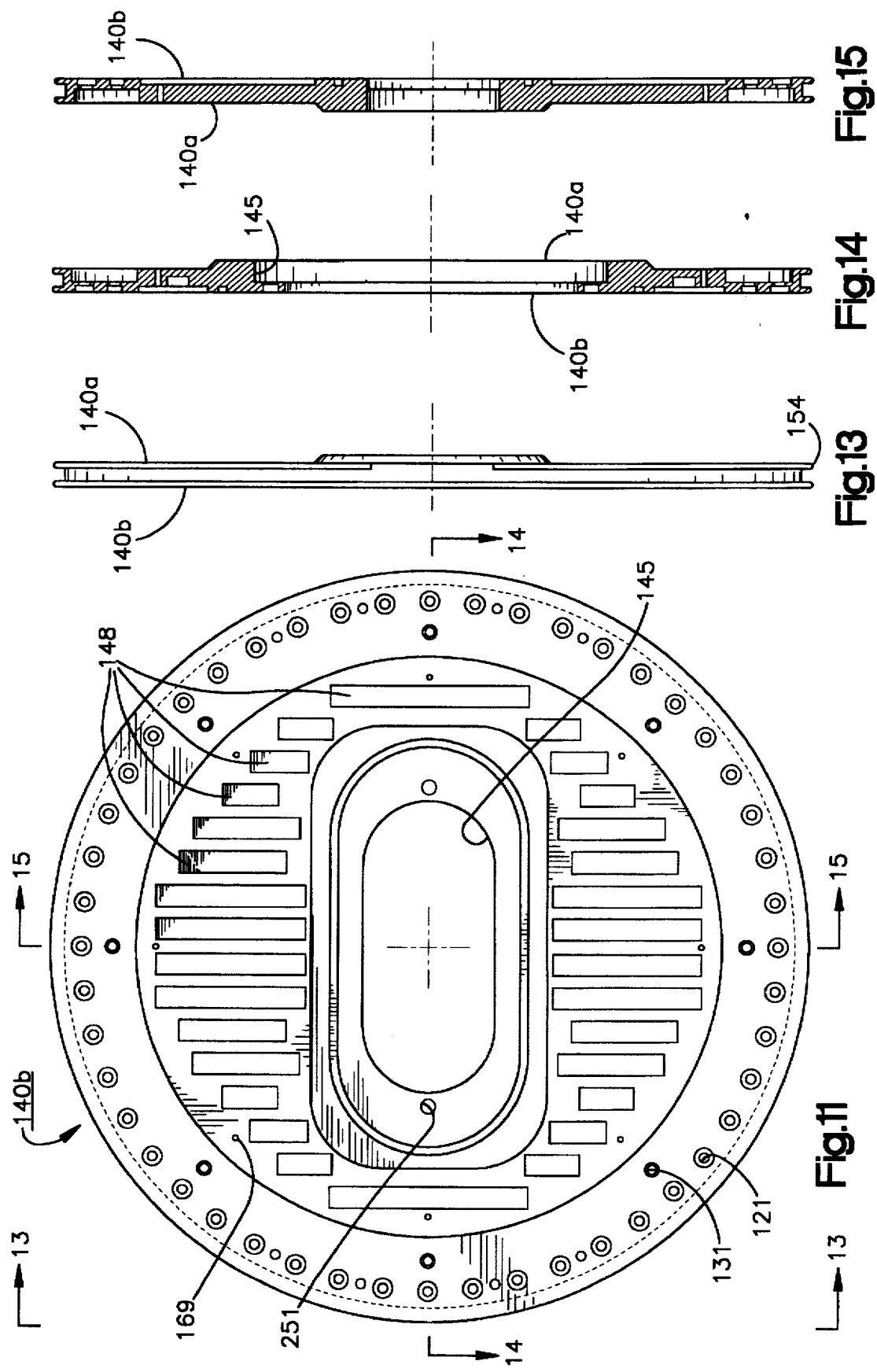

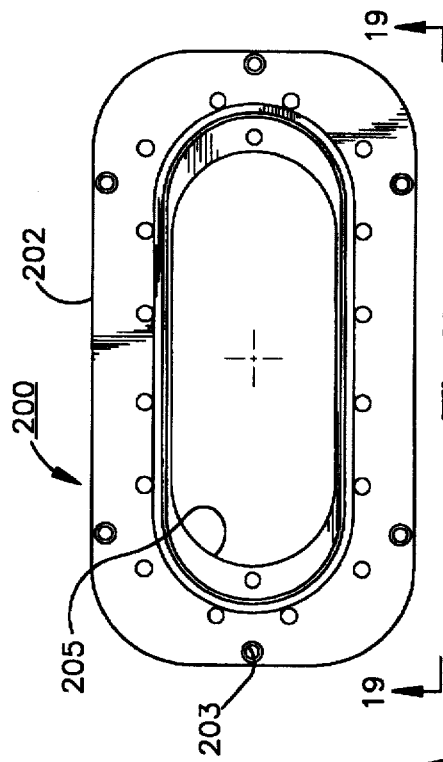
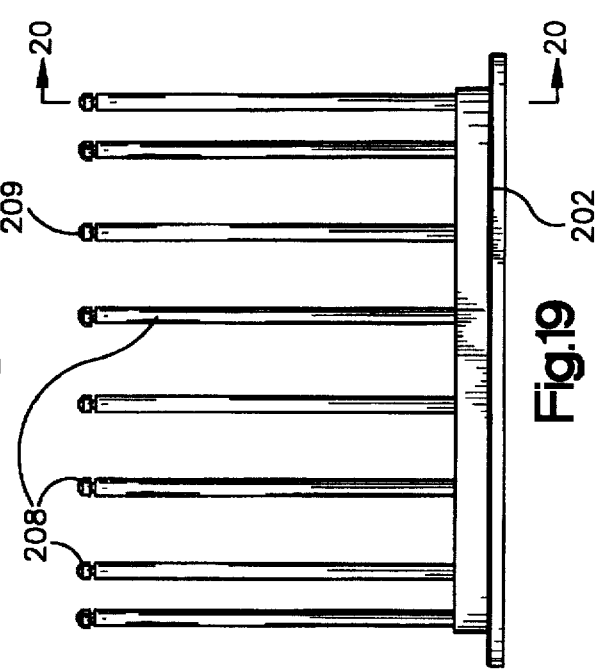
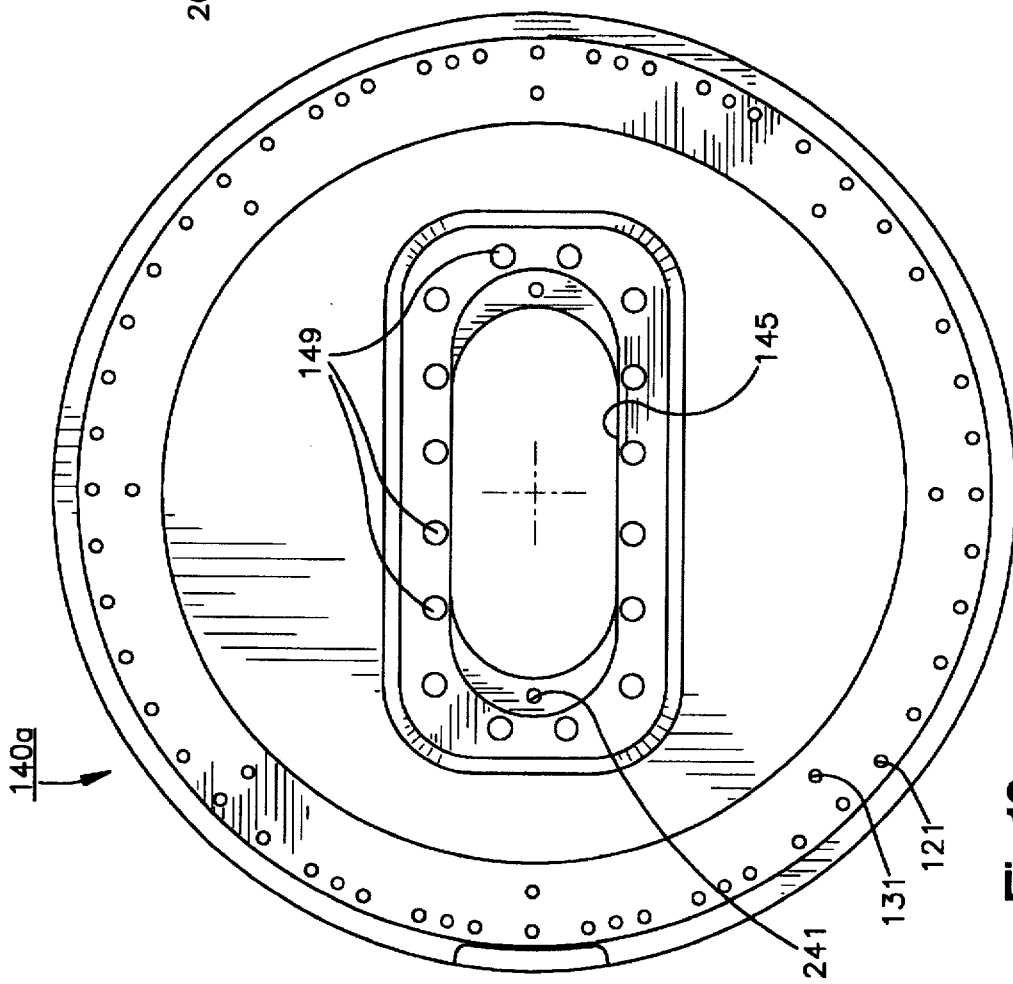

METHOD AND APPARATUS FOR ION BEAM NEUTRALIZATION

FIELD OF INVENTION

The present invention concerns a method and apparatus for neutralizing an ion beam used in beam treatment of a workpiece.

BACKGROUND OF THE INVENTION

Ion beam implanters are used to treat silicon wafers with an ion beam. Such treatment can produce n or p type extrinsic materials doping or can be used to form passivation layers during fabrication of an integrated circuit.

When used for doping semiconductors, the ion beam implanter injects a selected ion species to produce the desired extrinsic material. Implanting ions generated from source materials such as antimony, arsenic or phosphorus results in 'n type' extrinsic material wafers. If 'p type' extrinsic material wafers are desired, ions generated with source materials such as boron, gallium or indium are implanted.

The ion beam implanter includes an ion source for generating positively charged ions from ionizable source materials. The generated ions are formed into a beam and accelerated along a predetermined beam path to an implantation station. The ion beam implanter includes beam forming and shaping structure extending between the ion source and the implantation station. The beam forming and shaping structure maintains the ion beam and bounds an elongated interior cavity or region through which the beam passes en route to the implantation station. When operating the implanter, this interior region must be evacuated to reduce the probability of ions being deflected from the predetermined beam path as a result of collisions with air molecules.

Eaton Corporation, assignee of the present invention, currently sells high current implanters under the product designations NV 10, NV-GSD/200, NVGSD/160, and NV-GSD/80. One problem these prior art implanters address is the problem of wafer charging. As the ion beam is directed into contact with the wafer, the wafer charges as the positively-charged ions strike the wafer surface. The charging is often nonuniform and can create large electric fields at the wafer surface which can damage the wafer, making it unsuitable for use as a semiconductor material.

In some prior art implantation systems, an electron shower device is used to neutralize the space charge of the ion beam. Existing electron shower devices utilize secondary electron emissions caused when an energetic electron strikes a metal surface. Low-energy electrons emitted from the metal surface are either trapped in the ion beam or are directed to impact the wafer surface thereby directly neutralizing the wafer.

The current density of the electrons obtained by secondary emissions from a metal surface is limited by the potential difference between the ion beam and the emitting surface. Existing ion implanter neutralizers rely on electric fields to transport electrons from a region outside the ion beam, into the beam where they can be captured by the ion beam. Once they are captured by the ion beam, the electrons can move freely along the beam to the target where they cancel the positive ion beam current.

The electric fields that transport electrons to the ion beam also unfortunately deflect the beam ions outward away from their focused beam path. In order for the electrons to be captured by the beam, collisions between the electrons and the beam plasma particles (neutral and ionized) are required. If such collisions do not occur the electrons simply oscillate through and around the beam in ballistic motions. Collision rates between ions and the electrons are limited by the density of the electrons which determines the probability of a collision. Typically, the collision rates between electrons and ions result in incomplete neutralization and residual space charge effects of the positively charged ion beam remain significant.

A type of electron flood known as a "plasma bridge" partially addresses these constraints. A plasma of ions and electrons is produced in a cavity adjacent to the ion beam. The cavity is typically separate from the ion beam to allow a high density of gas to be used in the cavity to promote generation of the plasma. The plasma is allowed to "leak" out from the cavity through a small aperture. A large electron current flows from the aperture to the ion beam plasma. A large electron current flows from the cavity to the beam due to the approximate charge neutrality in the plasma bridge.

Even use of a plasma bridge requires an electric field along the bridge to maintain the current. As the plasma bridge expands from the aperture of the cavity where the plasma is created, electron diffusion is replaced by ballistic motion as the primary mode of electron transport.

To the extent that existing ion beam neutralization systems use electric fields from the region of electron generation to the region the electrons are injected into the beam, these fields also increase the kinetic energy of the electrons and therefore encourage the electrons to oscillate and avoid capture within the ion beam.

DISCLOSURE OF THE INVENTION

The present invention concerns an ion implanter for treatment of one or more workpieces with positively charged ions.

In accordance with a preferred embodiment of the invention, the ion implanter includes an ion source, beam forming structure, an ion beam neutralizer, and an ion treatment station. The ion source emits positively charged ions which are formed into an ion beam by the beam forming structure. The ion treatment station positions the one or more workpieces to intercept the ions from the ion beam as they enter the ion treatment station.

The ion beam neutralizer is positioned upstream from the ion treatment station along the ion beam path. According to the invention, the ion beam neutralizer includes a confinement structure which bounds the ion beam path. The structure defines an entrance plate and an exit plate to allow the ion beam to pass through a neutralization region before striking the one or more workpieces at the treatment station. A plasma source is positioned within the confinement structure to provide electrons within the neutralization region. The confinement structure further supports an array of magnets which create a magnetic field in the neutralization region that tends to confine electrons emitted from the electron source and thereby increase the concentration of electrons within the neutralization region.

Within the neutralization region, electric fields are generally low and electrons are displaced primarily by diffusion from regions of higher densities to regions of lower densities. Free electrons are thus either produced within the ion beam itself or diffuse into the beam from surrounding regions without any reliance on electric fields. Once electrons are captured by the beam, a large electron current flows along the ion beam to the one or more workpieces at the ion treatment station without the negative effect of electric fields on the ion beam trajectories.

The ion beam neutralizer must has a plasma density substantially higher than the ion beam's plasma density for diffusion processes to dominate electron motions. The ion beam neutralizer must also operate at a low gas pressure to avoid excessive attenuation of the ion beam.

According to another feature of the invention, the ion beam neutralizer comprises a filter rod assembly having a plurality of axially extending metallic filter rods which support a plurality of magnets inside the confinement structure. The filter rods form a magnetic filter field which generally bounds the ion beam and extends along the ion beam path. The filter rod assembly confines the more energetic electrons from exiting the ion beam and allows lower energy electrons to drift along the ion beam plasma. The filter rod assembly provides several advantages in ion beam neutralization. The filter rods limit the maximum possible negative charging of the one or more target workpieces. Furthermore, the filter rod assembly minimizes ion beam plasma heating near the upstream portion of the ion beam neutralizer.

A measure of performance of an electron flood is the voltage in the center of the ion beam upstream from the insulating target. A lower voltage corresponds to a lower residual space charge in the ion beam due to incomplete neutralization. It has been found that the ion beam neutralizer disclosed in the preferred embodiment resulted in a beam voltage of about 5 to 7 volts, where other conventional electron floods, using a similar ion beam, have beam voltages from about 15 to 60 volts.

BRIEF DESCRIPTION OF THE DRAWINGS

FIG. 3 is an elevation view showing a confinement body constructed in accordance with the preferred embodiment of the invention;

FIG. 4 is a view from the plane defined by the line 4—4 in FIG. 3;

FIG. 5 is a section view from the plane defined by the line 5—5 in FIG. 3;

FIG. 6 is a front elevation view of a first confinement body cover constructed in accordance with the preferred embodiment of the invention;

FIG. 7 is a rear elevation view of the cover of FIG. 6;

FIG. 8 is a view from the plane defined by the line 8—8 in FIG. 6;

FIG. 9 is a section view from the plane defined by the line 9—9 in FIG. 6;

FIG. 10 is a section view from the plane defined by the line 10—10 in FIG. 6;

FIG. 11 is a rear elevation view of a second confinement body cover constructed in accordance with the preferred embodiment of the invention;

FIG. 12 is a front elevation view of the cover of FIG. 11;

FIG. 13 is a view from the plane defined by the line 13—13 in FIG. 11;

FIG. 14 is a section view from the plane defined by the line 14—14 in FIG. 11;

FIG. 15 is a section view from the plane defined by the line 15—15 in FIG. 11;

FIG. 16 is a perspective view of a magnet mounted to the confinement body;

FIG. 17 is a perspective view of a magnet mounted to the first and second covers;

FIG. 18 is a front elevation view of a filter rod assembly that includes a plurality of magnetic filter rods constructed in accordance with the preferred embodiment of the invention;

FIG. 19 is a view from the plane defined by the line 19—19 in FIG. 18;

FIG. 20 is a section view of one filter rod as seen from the plane defined by the line 20—20 in FIG. 19;

FIG. 21 is a view of a retainer rod used to hold magnets in place on the confinement body;

BEST MODE FOR PRACTICING THE INVENTION

Figure 1:
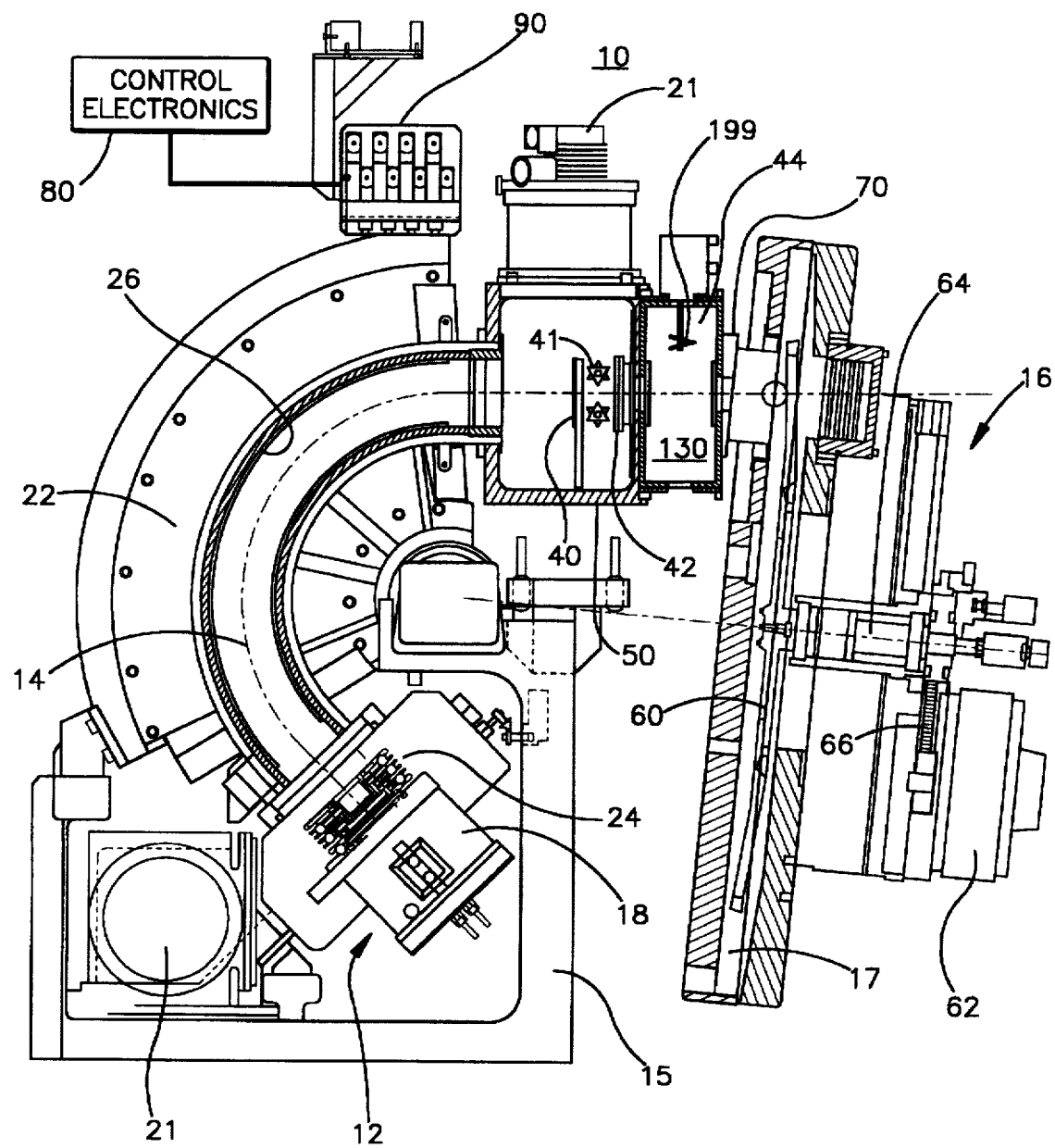
FIG. 1 is a schematic view of an ion implanter for ion beam treatment of a workpiece such as a silicon wafer mounted on a spinning support.

Turning now to the drawings, FIG. 1 depicts an ion beam implanter, shown generally at 10, which includes an ion source 12 mounted to an "L" shaped support 15 for providing ions that form an ion beam 14 which traverses a beam path to an implantation station 16. Control electronics (not shown) are provided for monitoring and controlling the ion dosage received by the wafers (not shown) within an implantation chamber 17 at the implantation station 16. The ions in the ion beam follow a predetermined, desired beam path that tends to diverge as the beam traverses the distance between the ion source 12 and the implantation station 16.

The ion source 12 includes a plasma chamber 18 defining an interior region into which source materials are injected. The source materials may include an ionizable gas or vaporized source material. Source material in solid form is deposited into a vaporizer which is then injected into the plasma chamber 18. If an n type extrinsic wafer material is desired, boron, gallium or indium will be used. Gallium and indium are solid source materials, while boron is injected into the plasma chamber 18 as a gas, typically boron trifluoride or diborane, because boron's vapor pressure is too low to result in a usable pressure by simply heating it. If a p type extrinsic material is to be produced, antimony, arsenic or phosphorus will be chosen as the solid source material. Energy is applied to the source materials to generate positively charged ions in the plasma chamber 18. The positively charged ions exit the plasma chamber through an elliptical arc slit in a cover plate overlying an open side of the plasma chamber 18.

The ion beam 14 travels through an evacuated path from the ion source 12 to an implantation chamber 17, which is also evacuated. Evacuation of the beam path is provided by vacuum pumps 21. One application of an ion source 12 constructed in accordance with the present invention is for a "low" energy implanter. The ion beam 14 of this type of implanter tends to diffuse over its beam path and hence the implanter has been designed to have a relatively "short" path from the source 12 to the implantation chamber 17.

Ions in the plasma chamber 18 are extracted through an arc slit in a plasma chamber cover plate and accelerated by a set of electrodes 24 adjacent the plasma chamber toward a mass analyzing magnet 22 fixed to the support 15. The set of electrodes 24 extract the ions from the plasma chamber interior and accelerate the ions into a region bounded by the mass analyzing or resolving magnet 22. An ion beam path through the magnet is bounded by an aluminum beam guide 26.

Ions that make up the ion beam 14 move from the ion source 12 into a magnetic field set up by the mass analyzing magnet 22. The strength and orientation of the magnetic field produced by the magnet 22 is controlled by the control electronics 80 coupled to a magnet connector 90 for adjusting a current through the magnet's field windings.

The mass analyzing magnet 22 causes only those ions having an appropriate mass to charge ratio to reach the ion implantation station 16. The ionization of source materials in the plasma chamber 18 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation.

The magnetic field generated by the mass analyzing magnet 22 causes the ions in the ion beam to move in a curved trajectory. The magnetic field that is established by the control electronics 80 is such that only ions having an atomic mass equal to the atomic mass of the desired ion species traverse the curved beam path to the implantation station chamber 17.

Located downstream from the magnet is a resolving plate 40. The resolving plate 40 is comprised of vitreous graphite and defines an elongated aperture through which the ions in the ion beam 14 pass. At the resolving plate 40 the ion beam dispersion, the width of the beam envelope is at a minimum.

The resolving plate 40 functions in conjunction with the mass analyzing magnet 22 to eliminate undesirable ion species from the ion beam 14 which have an atomic mass close to, but not identical, to the atomic mass of the desired species of ions. As explained above, the strength and orientation of the mass analyzing magnet's magnetic field is established by the control electronics 80 such that only ions having an atomic weight equal to the atomic weight of the desired species will traverse the predetermined, desired beam path to the implantation station 16. Undesirable species of ions having an atomic mass much larger or much smaller than the desired ion atomic mass are sharply deflected and impact the beam guide 26 or the slit boundary defined by the resolving plate 40.

An adjustable resolving slit 41 and a Faraday flag 42 are located between the resolving aperture 40 and an ion beam neutralizer 44. The Faraday flag 42 is movably coupled to a housing 50 that bounds the beam line. The Faraday flag 42 can be moved linearly into position to intersect the ion beam 14 to measure beam characteristics and, when the measurements are satisfactory, swung out of the beam line so as to not interfere with wafer implantation at the implantation chamber 17.

The beam forming structure also includes the beam neutralizer 44, commonly referred to as an electron shower. U.S. Pat. No. 5,164,599 to Benveniste, issued Nov. 17, 1992, discloses an electron shower apparatus in an ion beam implanter and is incorporated herein in its entirety by reference. The ions extracted from the plasma chamber 18 are positively charged. If the positive charge on the ions is not neutralized prior to implantation of the wafers, the doped wafers will exhibit a net positive charge. As described in the '599 patent, such a net positive charge on a wafer has undesirable characteristics.

A downstream end of the neutralizer 44 is adjacent the implantation chamber 17 where the wafers are implanted with ions. Supported within the implantation chamber is a disk shaped wafer support 60. Wafers to be treated are positioned near an outer edge of the wafer support and the support is rotated by a motor 62. An output shaft of the motor 62 is coupled to a support drive shaft 64 by a belt 66. The ion beam 14 strikes the wafers as they rotate in a circular path. The implantation station 16 is pivotable with respect to the neutralizer 44 and is connected to the housing 50 by a flexible bellows 70 (FIG. 1).

Figure 2:
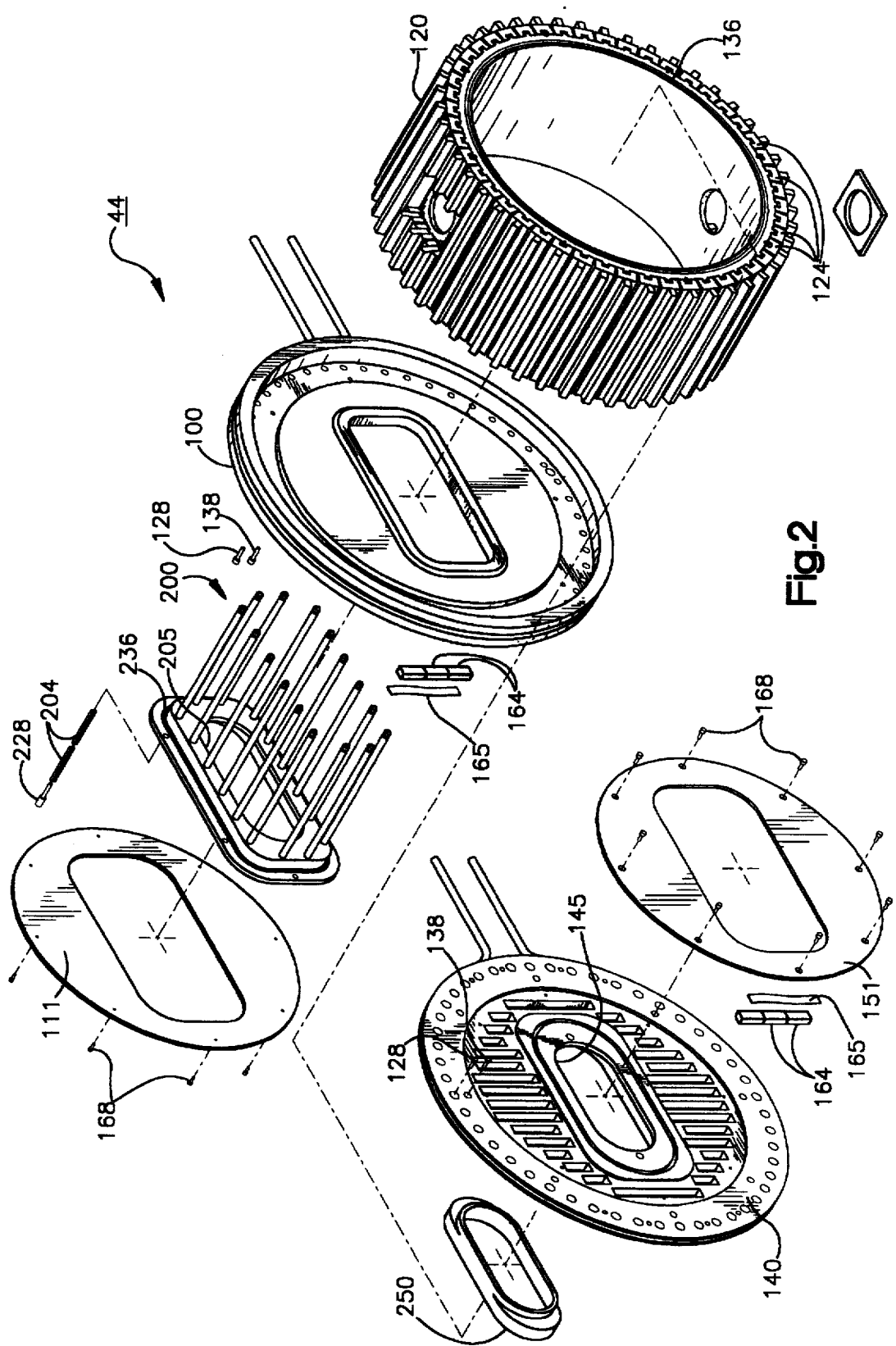
FIG. 2 is an exploded perspective view of an ion beam neutralizer constructed in accordance with a preferred embodiment of the invention.

FIGS. 2-23 depict a preferred embodiment of an ion beam neutralizer 44 constructed in accordance with the present invention. FIG. 2 is an exploded perspective view of the beam neutralizer 44. The beam neutralizer 44 includes a metallic first cover 100, metallic confinement body 120, and a metallic second cover 140 connected together and mounted to the implanter 10 in the position shown in FIG. 1 so that the beam 14 passes through the confinement body 120. The confinement body 120 supports an array of elongated external magnets 124 spaced at regular intervals around the perimeter of the confinement body 120. The covers 100, 140 include elongated generally rectangular openings 105, 145, respectively that allow the ion beam 14 to pass through the covers 100, 140 and body 120. The covers 100, 140 support a plurality of regularly spaced external magnets 164. The confinement body 120, the covers 100, 140, and the magnets 124, 164 form a confining magnetic field which tends to confine electrons moving within a region bound by the covers 100, 140 and confinement body 120 to allow those electrons to be captured by the electric potential of the ion beam.

Referring now to FIG. 3 of the preferred embodiment, the metallic (typically aluminum) confinement body 120 is a cylindrical structure having an interior region 130. In the preferred embodiment, the body 120 defines an array of ridges 122 surrounding its circumference. The ridges 122 are spaced by grooves 123 that position the elongated magnets 124 (shown in FIG. 16). As conceptually shown in FIG. 23A, the magnets 124 are oriented so that their magnetic poles alternate around the circumference of the body 120. The resultant magnetic confinement field 191 is indicated generally by dashed lines in FIG. 23A. Retainer rods 127 (shown in FIG. 21), which are about equal in length to the magnets 124, are mounted adjacent the magnets 124. The ends of the rods 127 define threaded openings 129 to accommodate fasteners 128 (shown in FIG. 2) inserted through holes 121 disposed around the perimeter of the covers 100, 140. The fastened retainer rods 127 prevent the adjacent magnets 124 from moving radially outward.

As shown in FIGS. 4 and 5, the confinement body 120 defines a pair of openings 125a, 125b to accommodate a pair of electron sources 126 (FIG. 23C) or an electron excitation source 199 (only one of which is shown in FIG. 1). The electron source or excitation source extends radially inward into the neutralization region 130 bound by the metallic confinement body 120. In the preferred embodiment, an electron excitation source comprises a resonance frequency antenna 199, as conceptually shown in FIG. 23B, and a power source 199a that emits electromagnetic energy which accelerates free electrons in the neutralization region 130 where they are captured by the electric potential of the ion beam plasma 14.

Figures 23A, 23B:
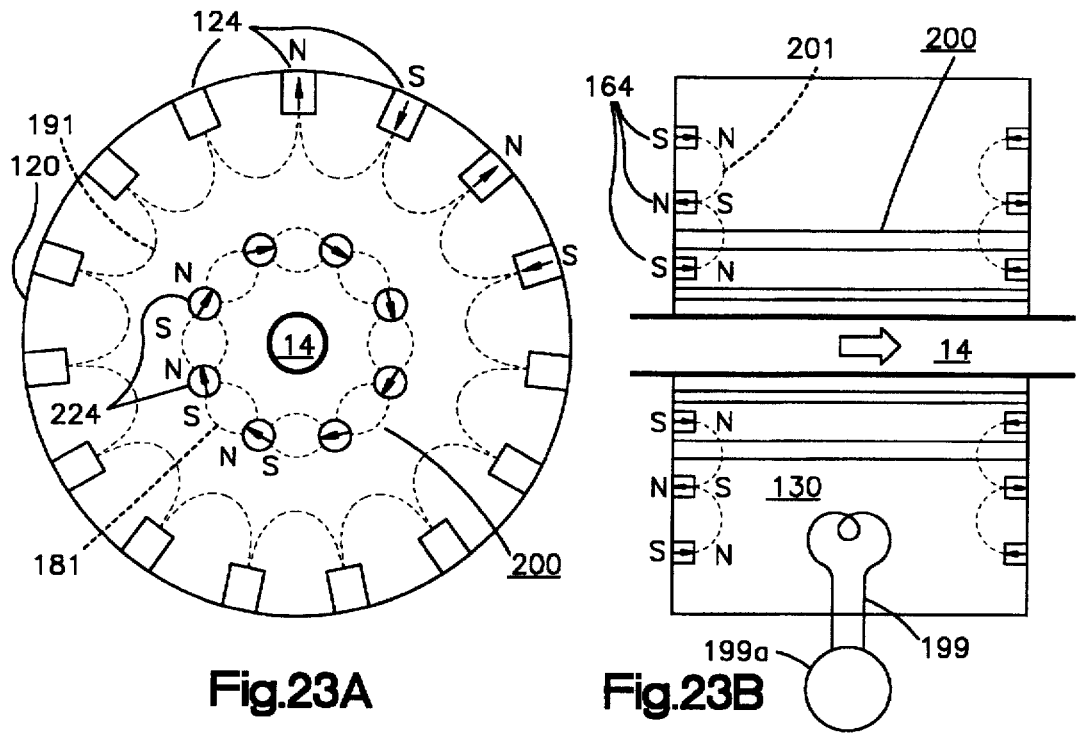
FIGS. 23A–23B are schematic depictions of an embodiment of the ion beam neutralizer showing a confining magnetic field and a magnetic field filter; and, FIGS. 23C–23D are schematic depictions of an alternative embodiment of the ion beam neutralizer showing a confining magnetic field.
Figures 23C, 23D:
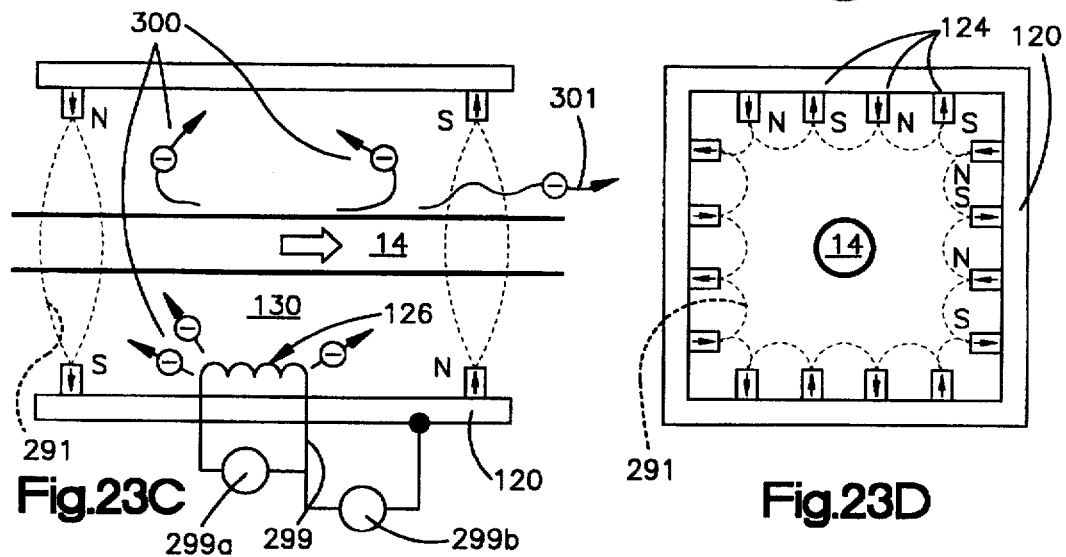

An alternative embodiment is conceptually shown in FIGS. 23C and 23D where the confinement body 120 is generally rectangular. In this embodiment, the electron source 126 comprises a filament cathode 299 and a power source 299a that injects electrons into the neutralization region 130 through which the ion beam 14 passes. A second power source 299b maintains a bias voltage between the grounded neutralizer body 120 and the filament cathode 299. As conceptually shown in FIG. 23D, the magnets 124 are oriented so that their magnetic poles alternate around the periphery of the body 120. The resultant magnetic confinement field 291 is indicated generally by dashed lines in FIGS. 23C and 23D. The magnetic confinement field 291 confines energetic electrons 300 and allows lower energy electrons 301 to drift along the ion beam 14.

The confinement body 120 further defines front and rear surfaces 120a, 120b, respectively, having grooves 135 to accommodate o-rings 136 (only one of which is shown in FIG. 2) and threaded openings 139 to accommodate a plurality fasteners 138. The metallic covers 100, 140 are connected to the surfaces 120a, 120b, respectively of the confinement body 120 by means of the fasteners 138 inserted through holes 131 disposed on a diameter of the covers 100, 140. As generally shown in FIG. 1, the outer surface of the confinement body 120 and of at least one cover 100, 140 of the ion beam neutralizer 44 is exposed to the atmosphere. In the preferred embodiment, the o-rings 136 are compressed between the body 120 and covers 100, 140 to seal out atmospheric pressure from the vacuum within the ion beam neutralizer 44.

FIGS. 6–10 show the metallic entrance cover 100 and FIGS. 11–15 show the metallic exit cover 140. The entrance cover 100 and exit cover 140 are axially spaced by and in concentric relation with the confinement body 120. The covers 100, 140 include a plurality of regularly spaced slots 108, 148, respectively, dimensioned to form a mating relationship with the magnets 164. As generally shown in FIG. 6, a slot 108 may support one or more magnets 164 depending on the location of the slot 108 on the entrance cover 100 and the size of the magnets 164. This is similarly shown in FIG. 11 for the exit cover 140. As conceptually shown in FIG. 23B, the magnets 164 are oriented so that their magnetic poles alternate from one magnet 164 to its adjacent magnet 164. The slots 108, 148 and magnets 164 are positioned so as to effect a magnetic confinement "wall" 201, indicated generally by dashed lines in FIG. 23B, to confine the free energetic electrons emitted by the electron source 126 or provided by the excitation source 199.

As shown in FIG. 2, a magnet confinement plate 111 is attached to the entrance cover 100, and a second magnet confinement plate 151 is attached to the cover 140 by means of fasteners 168 inserted into threaded openings 169 in the covers 100, 140. The plates 111, 151 secure the magnets 164 within the covers 100, 140. Copper tape strips 165 are mounted on the outer surface of the magnets 164 to eliminate or reduce movement of the magnets 164 within the slots 108 and to promote heat transfer from the magnets 164. The covers 100, 140 include flanged structure defining a coolant passageway 114, 154 (as shown in FIGS. 8 and 13), respectively, for routing cooling fluid around the circumference of the covers 100, 140. In the preferred embodiment, the cooling fluid dissipates heat generated by high-energy ion collisions with the covers 100, 140 and confinement body 120.

The entrance cover 100 further includes an opening 105 to support a filter rod assembly 200. The filter rod assembly 200 is attached to the cover 100 by means of fasteners (not shown) inserted into threaded openings 179 in the cover 100. In the preferred embodiment, an o-ring 236 is compressed between the cover 100 and the filter rod assembly 200 to seal out atmospheric pressure from the vacuum within the ion beam neutralizer 44. The filter rod assembly 200, generally shown in FIGS. 18, 19 and 20, includes a metallic flange 202 having an aperture 205 and a plurality of axially extending metallic filter rods 208 disposed near the periphery of the aperture 205. In the preferred embodiment, the flange 202 and filter rods 208 are made of a conductive material such as aluminum. The filter rods 208 extend through the length of the confinement body 120 and, at their downstream end 209, are tapered and supported by counterbores 149 (FIG. 12) in the cover 140. The filter rods 208 are spaced radially inwardly from the electron emitting source 126 and are oriented generally parallel to the direction of the ion beam path 14. As shown in FIG. 20, the filter rods 208 are broached to include interior passageways 206 to confine elongated magnets 224 (typically made of samarium cobalt). As conceptually shown in FIG. 23A, the magnets 224 self-align so that the pole of one magnet 224 tends towards the opposite pole of its neighboring magnet 224 around the periphery of the filter rod assembly 200. Threaded openings 229 in the filter rods 208 accommodate fasteners 228 (shown in FIG. 2) to retain the magnets 224 within the rods 208. The aperture 205 and filter rods 208 form a magnetic filter field 181 (indicated generally by dashed lines in FIG. 23A) which bounds the ion beam 14. The magnetic filter field 181 confines higher energy electrons from leaving the ion beam region and permits lower energy electrons to drift elsewhere within the confinement body 120 and along the ion beam 14. This phenomena is explained in more detail in the paper "Electron Flow Through Transverse Magnetic Fields in Magnetic Multipole Arc Discharges," by A. J. T. Holmes, Rev. Sci. Instrum. 53(10), Oct. 1982, P1517 which is incorporated herein by reference.

The filter rods limit the maximum possible negative charging of the one or more target workpieces. Furthermore, the filter rod assembly 200 minimizes heating of the ion beam plasma 14 near the upstream portion of the ion beam neutralizer 44. High energy electrons collide with beam plasma electrons through "Coulomb" collisions, exchanging kinetic energy. As a result, beam plasma electrons have a higher mean energy.

Figure 22:
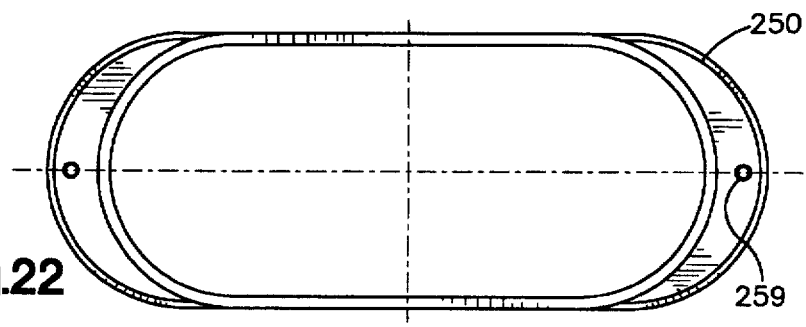
FIG. 22 is a rear elevation view of an exit flange.

Referring now to FIG. 22, an exit flange 250 is mounted to the exit cover 140 by means of fasteners (not shown) inserted through holes 251 in the exit cover 140 and into threaded openings 259 in the exit flange 250. The exit flange 250 (typically made of vitreous graphite) defines an aperture 255 that allows the ion beam 14 to pass through the exit cover 140 while shielding the cover 140 from bombardment of ions.

From the above description of a preferred embodiment of the invention, those skilled in the art will perceive improvements, changes and modifications. All such improvements, changes and modifications are intended to be covered which fall within the spirit or scope of the appended claims.

We claim:

1. An ion implanter for treating one or more workpieces with positively charged ions comprising:
   a) an ion source for emitting positively charged ions from a source location;
   b) structure for forming an ion beam from the positively charged ions exiting the source;
   c) an ion treatment station for positioning the one or more workpieces to intercept the ions in the ion beam as they enter the ion treatment station;
   d) an ion beam neutralizer positioned upstream along the ion beam path from the treatment station of the one or more workpieces, said beam neutralizer comprising:
      i.) confinement structure bounding the ion beam path that defines an entrance plate and an exit plate to allow the ion beam to pass through a neutralization region before striking the one or more workpieces at the treatment station;

ii.) an electron source for providing electrons within the neutralization region as the ion beam passes through the confinement structure; and iii.) an array of magnets supported by the confinement structure for setting up a magnetic field in the neutralization region that tends to confine electrons from the electron source within the confinement structure.

2. The ion implanter of claim 1 wherein the electron source comprises a filament cathode and a power source for passing an electric current through the filament cathode.

3. The ion implanter of claim 2 wherein the array of magnets circumferentially bounds planes occupied by the exit plate and the entrance of the confinement structure.

4. The ion implanter of claim 3 wherein the magnets are permanent magnets.

5. In an ion implanter having an ion source for emitting positively charged ions from a source location, structure for forming an ion beam from the positively charged ions exiting the source, and an ion treatment station for positioning one or more workpieces to intercept the ions in the ion beam as they enter the ion treatment station, a method for injecting neutralizing electrons into the ion beam at a location upstream along the ion beam path from a beam treatment position of the one or more workpieces comprising the steps of bounding the ion beam path with confining structure that includes an entrance and an exit to allow the ion beam to pass through a neutralization region before striking the one or more workpieces at the treatment station; providing electrons within the neutralization region as the ion beam passes through the confinement structure; and confining electrons from the electron source within the confinement structure by means of a magnetic field provided by structure mounted on said confinement structure.

6. An ion beam neutralizer for use with an ion implanter comprising:

a) a metallic confinement body supported in relation to an ion beam travel path and having a sidewall that extends along a length of the ion beam travel path and includes an entrance cover having an entrance opening to allow an ion beam to enter a neutralization region bound by the metallic confinement body and which also includes an exit cover having an exit opening to allow the ion beam to pass from the neutralization region and exit the confinement body to strike one or more workpieces;

b) a plurality of magnets supported by the confinement body and spaced in relation to the entrance cover, exit cover and side wall of the confinement body to set up a confining magnetic field within the neutralization region; and c) means supported within the neutralization zone for concentrating a high density of neutralizing electrons within the neutralization region for capture by the ion beam as the beam passes through the neutralization region.

7. The ion beam neutralizer of claim 6 wherein the confinement body is substantially cylindrical.

8. The ion beam neutralizer of claim 7 wherein at least some of the magnets are axially disposed around a circumference of said substantially cylindrical confinement body.

9. The ion beam neutralizer of claim 6 additionally comprising an entrance plate and an exit plate attached to the respective entrance and exit covers; said plates having openings substantially concentric with the openings of said entrance and exit covers and having inwardly facing surfaces that hold magnets against outwardly facing surfaces of the entrance and exit covers to help define the confining magnetic field.

10. The ion beam neutralizer of claim 6 wherein the entrance cover supports a filter rod assembly comprising a metallic flange having an aperture and a plurality of axially extending metallic filter rods disposed near the periphery of said aperture which extend along the ion beam path and support a plurality of magnets radially inward to magnets that are supported by the side wall of the confinement body.

11. The ion beam neutralizer of claim 10 wherein the filter rods are broached to accommodate the filter rod magnets.

12. The ion beam neutralizer of claim 11 wherein the filter rods extend substantially the length of the confinement body.

13. The ion beam neutralizer of claim 6 wherein the magnets are permanent magnets.

14. The ion beam neutralizer of claim 6 wherein each of said covers defines a coolant passageway for routing a cooling fluid to dissipate heat generated by high-energy ion collisions with the covers and confinement body.

15. The ion beam neutralizer of claim 6 wherein the wall of the confinement body defines at least one opening and wherein the means for concentrating electrons within the neutralization region comprising at least one current carrying electron source mounted directly within the neutralization region of the confinement body to inject electrons directly into the neutralization region.

16. The ion beam neutralizer of claim 15 wherein the electron source comprises a filament cathode and a power source for passing an electric current through the filament cathode.

17. The ion beam neutralizer of claim 6 wherein the wall of the confinement body defines at least one opening and wherein the means for concentrating electrons within the neutralization region comprises a resonance frequency antenna and a power source that energizes free electrons within the neutralization region of the confinement body.

18. The ion beam neutralizer of claim 6 comprising:

a) a plurality of axially elongated magnets supported at regularly spaced intervals on a circumference of a generally cylindrical metallic body;

b) a pair of axially spaced metallic covers having generally concentric openings relative to the body and dimensioned to allow an ion beam to pass through the covers and body;

c.) a plurality of regularly spaced magnets supported by the metallic covers;

d.) a plurality of axially elongated metallic filter rods bounding the ion beam and oriented generally parallel to a direction of an ion beam path.

19. The ion beam neutralizer of claim 18 wherein the filter rods extend substantially the length of the metallic body.

20. The ion beam neutralizer of claim 18 wherein the filter rods are broached to encapsulate at least one filter magnet.

21. The ion beam neutralizer of claim 18 wherein the metallic covers define flanged structure for routing a coolant to dissipate heat caused by ion collisions with the covers and body.

22. The ion beam neutralizer of claim 18 wherein the metallic body defines an opening having an radially inwardly extending electron source to supply high-energy electrons within the metallic body.

* * * * *